United States Patent
Gallerano et al.

(10) Patent No.: US 7,808,047 B1
(45) Date of Patent: Oct. 5, 2010

(54) I/O ESD PROTECTION DEVICE FOR HIGH PERFORMANCE CIRCUITS

(75) Inventors: Antonio Gallerano, San Jose, CA (US); Cheng-Hsiung Huang, Cupertino, CA (US); Chih-Ching Shih, Pleasanton, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 427 days.

(21) Appl. No.: 11/897,915

(22) Filed: Aug. 31, 2007

Related U.S. Application Data

(60) Continuation-in-part of application No. 11/185,609, filed on Jul. 19, 2005, now Pat. No. 7,326,998, which is a continuation-in-part of application No. 10/882,874, filed on Jun. 30, 2004, now Pat. No. 7,195,958, which is a division of application No. 10/298,104, filed on Nov. 14, 2002, now Pat. No. 6,777,721.

(51) Int. Cl.
*H01L 23/62* (2006.01)
(52) U.S. Cl. .................. 257/355; 257/356; 257/360; 361/111
(58) Field of Classification Search ............. 257/355, 257/356, 360–363; 361/56, 111; 438/224
See application file for complete search history.

(56) References Cited

U.S. PATENT DOCUMENTS 5,594,265 A * 1/1997 Shimizu et al. ............ 257/355

* cited by examiner

*Primary Examiner*—Zandra Smith
*Assistant Examiner*—Paul E Patton
(74) *Attorney, Agent, or Firm*—Ward & Olivo

(57) ABSTRACT

A trigger circuit is provided for a pull-down device by connecting a diode between the I/O pad and the body of the pull-down device. In one embodiment, the pull-down device is formed as a plurality of discrete transistors in a single well. The drain of each transistor is connected through a ballast resistor to the I/O pad; and the source of each transistor is connected through a ballast resistor to ground. The trigger circuit is a diode formed in a different well from that of the transistors. The cathode of the diode is connected to the I/O pad and the anode is connected to the transistor well through a center tap located between the transistors. Preferably, the transistors are NMOS transistors formed in a P-well. Advantageously, the diode is an N+/PLDD diode. Alternatively, the diode is an N+/P diode where the P region is formed by an ESD implant. In other embodiments the diode is formed in the same well as the transistors. In these embodiments, either an N+/PLDD diode or an implanted diode is formed in place of one of the transistors.

15 Claims, 16 Drawing Sheets

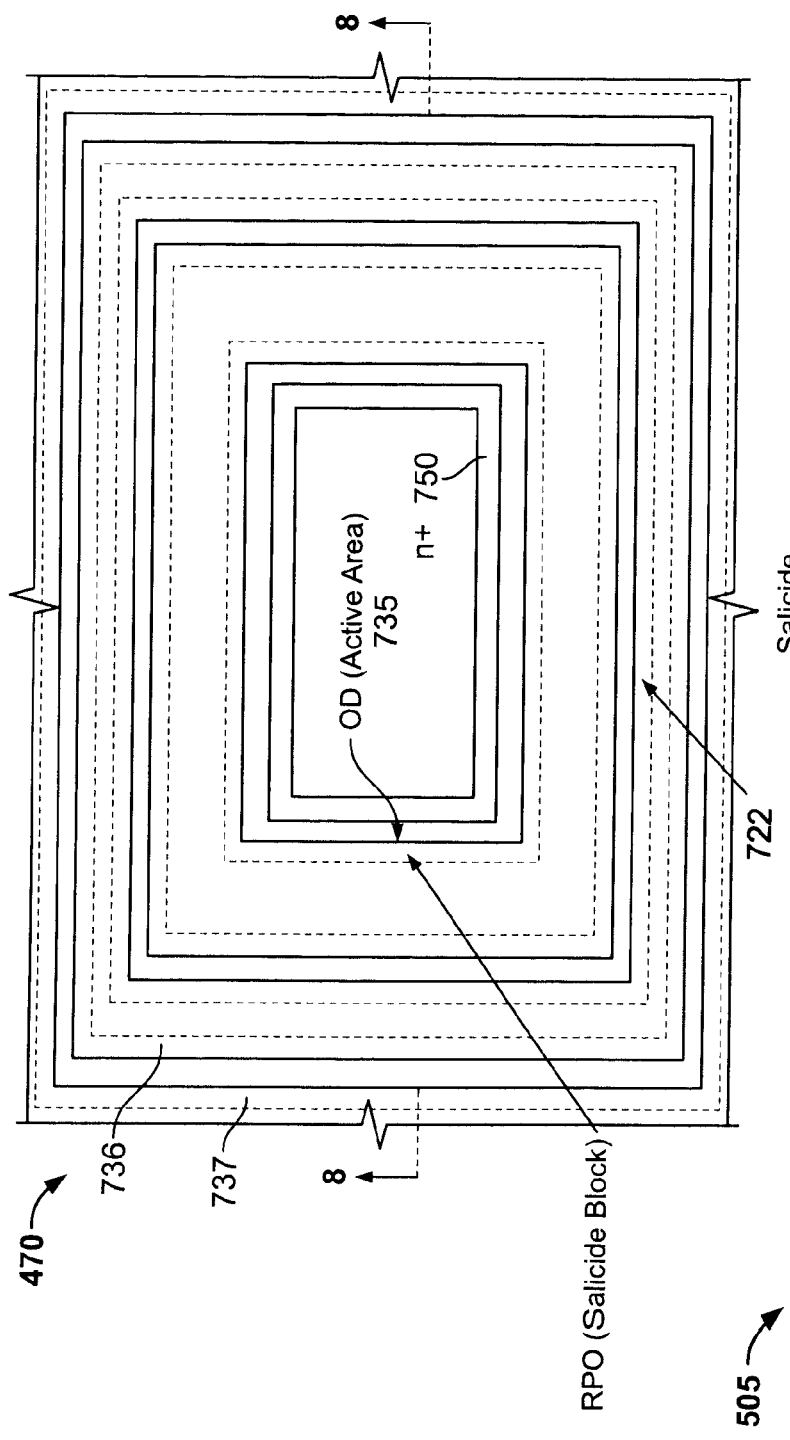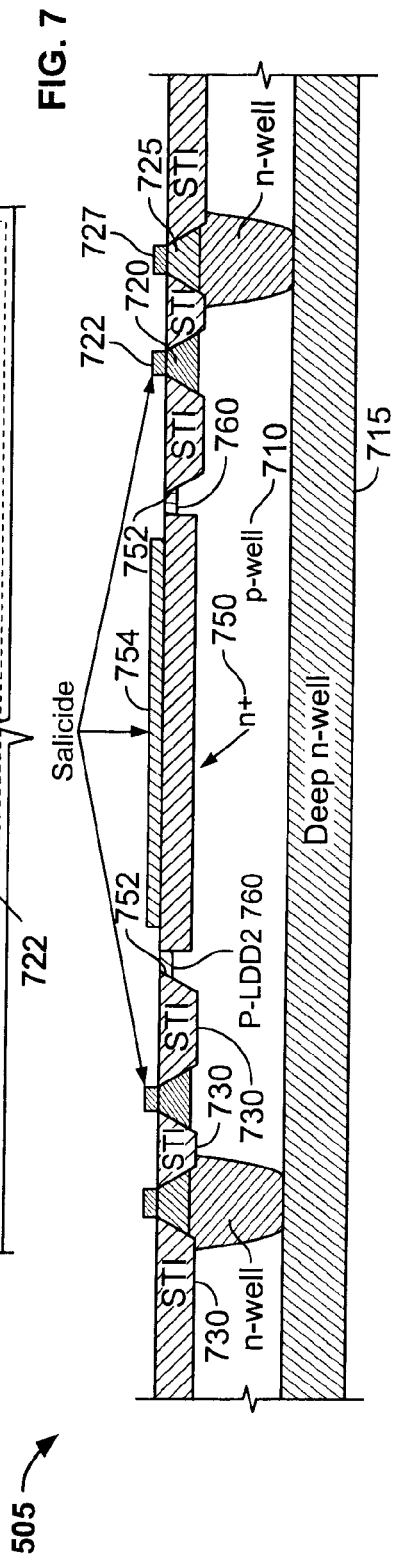
FIG. 7
FIG. 8

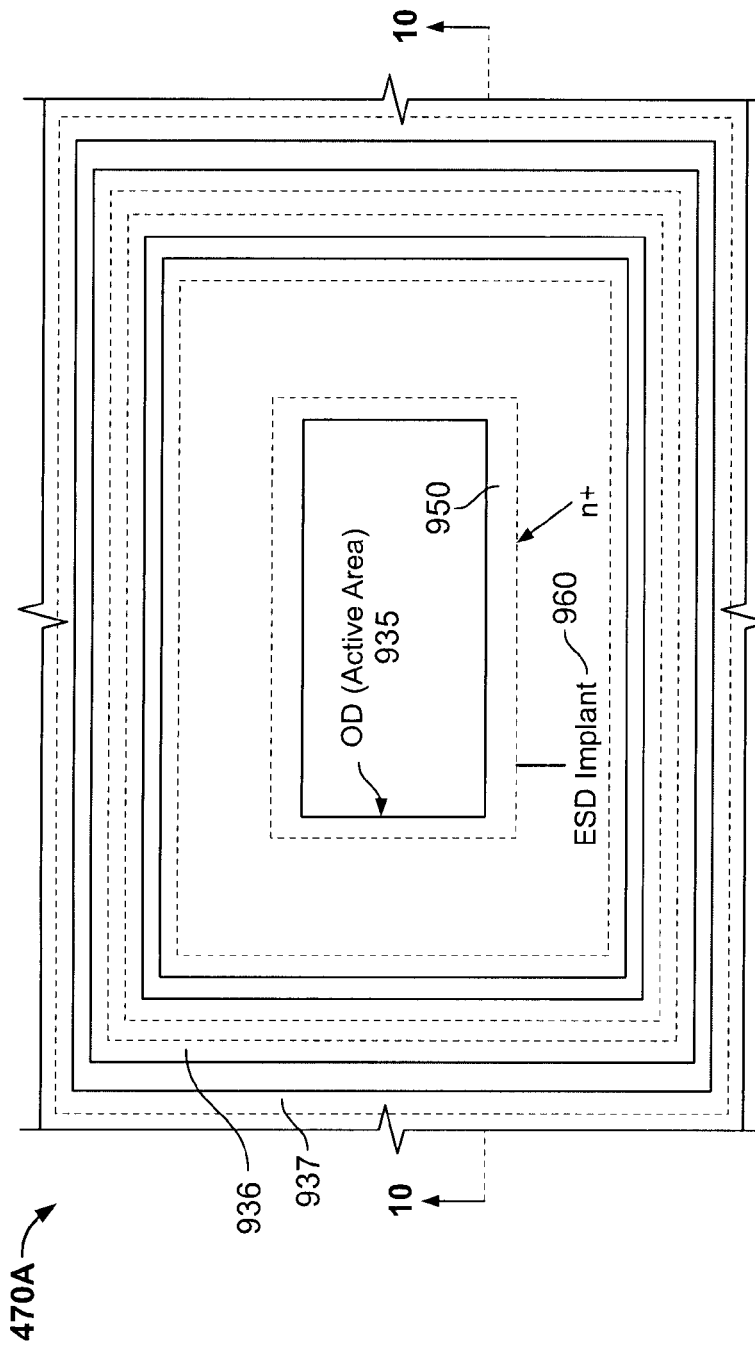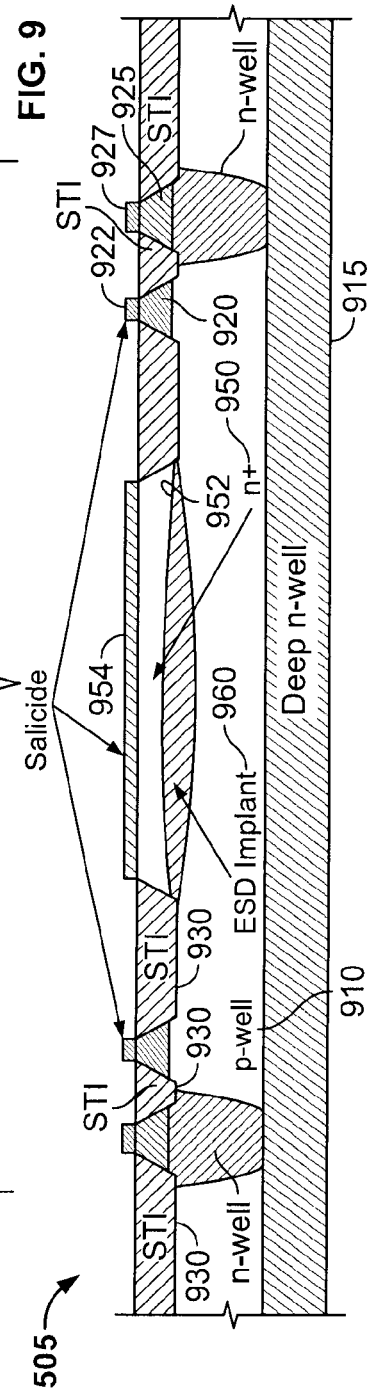
FIG. 9
FIG. 10

I/O ESD PROTECTION DEVICE FOR HIGH PERFORMANCE CIRCUITS

CROSS-REFERENCE TO RELATED APPLICATIONS

This application is a continuation-in-part of application Ser. No. 11/185,609, filed Jul. 19, 2005 now U.S. Pat. No. 7,326,998 which is a continuation-in-part of application Ser. No. 10/882,874, filed on Jun. 30, 2004 now U.S. Pat. No. 7,195,958, which is a divisional of application Ser. No. 10/298,104, filed on Nov. 14, 2002 now U.S. Pat. No. 6,777,721, all of which are incorporated herein by reference.

BACKGROUND OF THE INVENTION

I/O pull-down devices have regularly been used to protect I/O logic circuits from electrostatic discharge (ESD). One such I/O pull-down device 100 is shown in FIG. 1. Device 100 comprises a P-well or P-type substrate or body 110 having P+ taps or contacts 120, a polysilicon gate 140 on the substrate and insulated therefrom by gate oxide 145, heavily doped N-type source and drain regions 150, 160, and N-type lightly doped drain (LDD) regions 155, 165 extending toward each other in the substrate from the source and drain regions. A parasitic NPN bipolar transistor is formed in this device in which the source and drain regions 150, 160 are the emitter and collector of the transistor and the P-well or substrate 110 is the base. The structure of a typical I/O logic device is similar to that of device 100 and is typically formed in the same integrated circuit as I/O pull-down device 100.

FIG. 2 is a top view of an implementation of device 100 of FIG. 1. Device 100 is formed in a portion of a semiconductor substrate 205. A P-well 210 is formed in that portion and electrical connection to the P-well is made through P+ well taps 220. Illustratively, the P-well tap extends around the entire periphery of P-well 210. An NMOS transistor is formed in the P-well having a plurality of gate fingers 240 and N+ source/drain regions 250 on both sides of the gate fingers. While not shown in FIG. 2, N-type lightly doped drain (LDD) regions extend toward each other from the source/drain regions 250 on both sides of each gate finger 240.

FIG. 3 depicts the use of device 100 in a typical input/output circuit 300. Circuit 300 comprises pull-down device 100 connected between an I/O pad 392 and ground $V_{SSIO}$. Pull-down device protects from ESD events one or more logic circuits 302 containing devices that are similar to device 100 and connected between I/O pad 392 and ground. Illustratively, a first ballast resistor 362 is connected between drain 360 of pull-down device 100 and the I/O pad and a second ballast resistor 352 is connected between source 350 of device 100 and ground. P-well or P-type substrate or body 110 of device 100 is connected to ground. Ballast resistors 352, 362 are used to provide a more uniform current distribution through device 100. Alternatively, a salicide block could be used. The resistance of the P-type body is represented in the schematic by resistor 312. A diode 394 is connected between I/O pad 392 and ground with its cathode connected to the I/O pad and its anode connected to ground. Diode 394 is used to discharge negative voltage electrostatic events.

Since both the I/O pull-down device and the circuitry that it is intended to protect are in general formed at the same time through the same implants, the breakdown voltage of the I/O pull-down device and that of any other NMOS device connected to the pad are substantially the same. In the absence of an input resistance to isolate the NMOS I/O pull-down device from the circuits to be protected, some layout techniques can be adopted to prevent competitive triggering such as locating the p+ taps of the I/O pull down device at a larger distance from its active area compared to the distance between the circuits to be protected and their taps. However, capacitive coupling of sensitive nodes to the pad potential or specific topologies can still create the potential of competitive triggering unless the triggering voltage of the I/O pull down device is lowered significantly.

Various methods are used for reducing the trigger voltage of the I/O pull-down transistor. In U.S. Pat. No. 6,882,009 of M. Ker et al., P-type pocket implants are used next to the source/drain regions. However, since the P-type pocket implants are used throughout the circuit, this reduces the trigger voltage of both the pull-down transistors and the logic transistors. As a result, the I/O pull-down transistor may not be able to protect the I/O logic circuit. In addition, the P-type pocket implant can degrade the transistor performance by increasing its junction capacitance, and thereby reducing its speed, and can increase the transistor leakage. In M. Ker et al., "ESD Implantation for On-Chip ESD Protection with Layout Consideration in 0.18 um Salicided CMOS Technology," IEEE Transactions on Semiconductor Manufacturing, Vol. 18, No. 2, pp. 328-337 (May 2005), a P-type ESD implant is located vertically under the source-drain area. This, however, significantly increases the junction capacitance and affects the transistor performance. It also increases the transistor leakage.

In the above-referenced application Ser. No. 11/185,609 which is incorporated herein by reference, an ESD protection device is disclosed in which a P-type region is formed underneath a portion of each N-type LDD region so that a P-N junction is formed with the drain/source region. In the embodiment of FIG. 2 of application Ser. No. 11/185,609, the location of the P-type region and therefore the location of the P-N junction is indicated generally by the dashed rectangle 280. The rectangular region 280 is shown to cover the center area of the transistors for illustrative purposes, although it can be anywhere in the transistors. Preferably, the width W of the rectangular region 280 is approximately 25% of the width $W_{LDD}$ of an LDD region although greater widths can be used.

SUMMARY OF INVENTION

In a preferred embodiment of the invention, a trigger circuit is provided for a pull-down device by connecting a diode between the I/O pad and the body of the pull-down device.

The trigger circuit and the pull-down device can be implemented in a variety of ways. In one embodiment, the pull-down device is formed as a plurality of discrete transistors in a single well. The drain of each transistor is connected through a ballast resistor to the I/O pad; and the source of each transistor is connected through a ballast resistor to ground. The trigger circuit is a diode formed in a different well from that of the transistors. The cathode of the diode is connected to the I/O pad and the anode is connected to the transistor well through a center tap located between the transistors.

Preferably, the transistors are NMOS transistors formed in a P-well. Advantageously, the diode is an N+/PLDD diode. Alternatively, the diode is an N+/P diode where the P region is formed by an ESD implant.

In other embodiments the diode is formed in the same well as the transistors. In these embodiments, either an N+/PLDD diode or an implanted diode is formed in place of one of the transistors.

The trigger circuit and pull-down device are formed in separate wells by the following process steps. First, the surface of a semiconductor substrate is divided by shallow trench isolations (STIs). Separate wells of a first conductivity type are then formed. In the case of the first well in which the pull-down device is formed, the STIs circumscribe the areas where the transistors are to be formed so as to divide the surface of the well into a plurality of parallel regions. In the case of the second well in which the trigger device is formed, the STIs are concentric rectangles so as to divide the surface into a central region and a peripheral region surrounding the central region but separated therefrom. A gate oxide is then grown on the surface of each well and a gate is then formed in each of the parallel regions of the first well. Next, the first well is lightly doped on both sides of each gate with a dopant of a second (or opposite) conductivity type; and the second well is lightly doped with a dopant of the first conductivity type. Preferably, each lightly doping step is performed at the same time and therefore with the same dopant concentration as LDD regions of that conductivity type are doped in other parts of the integrated circuit.

Sidewalls are then formed on each of the gates of the first well. Then, the first well is heavily doped on both sides of each gate with dopant of the second conductivity type so as to form source and drain regions from which the lightly doped regions extend. Simultaneously, the second well is heavily doped in a portion of the central region with a dopant of the second conductivity type so as to form a P/N junction at the interface between the heavily doped portion of the central region and the remainder of the central region that previously was lightly doped with a dopant of first conductivity type. As a result, a plurality of MOS transistors of the second conductivity type are formed in the first well; and, where the heavily doped region of second conductivity type contacts the lightly doped region of first conductivity type in the second well, a diode is formed that is heavily doped on one side of its P/N junction and lightly doped on the other. The diode is then connected between the I/O pad to be protected and the body of the pull-down device.

Preferably, the first conductivity type is P-type and the second conductivity type is N-type so that the wells are P-wells, the transistors are NMOS transistors and the cathode of the diode is connected to the I/O pad and the anode to the first P-well.

In an alternative embodiment, the diode may be formed in the second well using an implanted region of first conductivity type instead of a lightly doped region of first conductivity type. In this alternative, no lightly doped step is performed in the second well. Rather, the entire central region on the surface of the second well is heavily doped with the dopant of second conductivity type to form a heavily doped region of second conductivity type and a region of first conductivity type is formed underneath this region but in contact with it by implanting ions of the first conductivity type. As a result, a P/N junction diode is formed at the interface between the heavily doped region of second conductivity type and the ion implanted region of first conductivity type. The diode is then connected between the I/O pad to be protected and the body of the pull-down device.

A single well embodiment of the ESD protection device of the present invention is formed by the following process steps. First, the surface of a semiconductor substrate is divided into a series of parallel regions by a plurality of shallow trench isolations (STI) that circumscribe the areas where the transistors are to be formed. A well of a first conductivity type is then formed. A gate oxide layer is then grown on the surface of the well and a gate is formed in each of the regions defined by the STIs. Next, the well is lightly doped on both sides of all but one gate with a dopant of a second conductivity type; and the well is lightly doped on both sides of the remaining gate with a dopant of the first conductivity type. Sidewalls are then formed on each of the gates. Then, the well is heavily doped on both sides of each gate with dopant of the second conductivity type so as to form source and drain regions from which the lightly doped drain regions extend. As a result, a plurality of MOS transistors are formed of the second conductivity type. In addition, where the heavily doped source and drain regions of second conductivity type contact lightly doped regions of the first conductivity type, a diode is formed that is heavily doped on one side of its P/N junction and lightly doped on the other. The heavily doped side of the diode is then connected to the I/O pad. The lightly doped side is in direct contact with the well in which the MOS transistors are formed. The gate over the diode is not connected to the other diodes but rather is grounded.

An alternative embodiment of the single well ESD protection device of the present invention does not use a lightly doped region of a first conductivity type. The same process steps as set forth in the paragraph immediately above are followed through formation of a gate in each of the regions defined by the STIs. Next, the well is lightly doped on both sides of each gate with a dopant of a second conductivity type. Sidewalls are then formed on each of the gates. Then, the well is heavily doped on both sides of each gate with a dopant of the second conductivity type so as to form source and drain regions from which the lightly doped drain regions extend. A region of first conductivity type is formed underneath and in contact with the source and drain regions on opposite sides of one gate by implanting ions of a first conductivity type. As a result, a plurality of MOS transistors of the second conductivity type are formed at those gates where ion implantation does not take place. In addition, where the heavily doped source and drain regions of second conductivity type contact the ion implanted region of the first conductivity type, a P/N junction diode is formed. The ion implanted side of the diode is in direct contact with the well in which the MOS transistors are formed. The other side is connected to the I/O pad. Again, the gate over the diode is grounded.

Another single well embodiment of the ESD protection device of the present invention is formed by the following process steps. In this embodiment, a trigger diode is formed in a part of the well, preferably the center, where a transistor otherwise would have been formed. First, the surface of a semiconductor substrate is divided into a series of parallel regions by a plurality of shallow trench isolations (STIs) that circumscribe the areas where the transistors are to be formed. A well of a first conductivity type is then formed. An oxide layer is then grown on the surface of the well and a gate is then formed in each of the regions defined by the STIs. Next, the well is lightly doped on both sides of each gate with a dopant of a second conductivity type; and the well is lightly doped in the region where the diode is to be formed with a dopant of the first conductivity type. This is accomplished by masking the area where the diode is to be formed when doping with dopants of the second conductivity type and masking everything but the area where the diode is to be formed when doping with dopants of the first conductivity type. Sidewalls are then formed on each of the gates. Then, the well is heavily doped on both sides of each gate with a dopant of the second conductivity type so as to form source and drain regions from which the lightly doped drain regions of second conductivity type extend. At least one heavily doped region also contacts the region that was lightly doped with dopants of the first conductivity type. Again, the region where the diode is to be formed is masked during this doping step. As a result, a plurality of MOS transistors of the second conductivity type are formed. In addition, where the heavily doped source and drain regions of second conductivity type contact lightly doped regions of the first conductivity type, a diode is formed that is heavily doped on one side of its P/N junction and lightly doped on the other. The heavily doped side of the diode is then connected to the I/O pad. The lightly doped side is in direct contact with the well in which the MOS transistors are formed.

Another alternative embodiment of the ESD protection device of the present invention likewise does not use a lightly doped region of a first conductivity type. Again, the same process steps as set forth in the paragraph immediately above are followed through formation of a gate in each of the regions defined by the STIs. Next, the well is lightly doped on both sides of each gate with a dopant of a second conductivity type. Sidewalls are then formed on each of the gates. Then, the well is heavily doped on both sides of each gate with a dopant of the second conductivity type so as to form source and drain regions from which the lightly doped drain regions extend. At least one region of first conductivity type is formed underneath and in contact with at least one the source and drain regions by implanting ions of a first conductivity type. As a result, a plurality of MOS transistors are formed of the second conductivity type. In addition, where the heavily doped source and drain regions of second conductivity type contact lightly doped regions of the first conductivity type, a diode is formed. The heavily doped side of the diode is then connected to the I/O pad. The lightly doped side is in direct contact with the well in which the MOS transistors are formed.

In a typical application of the invention, the foregoing steps are used to form simultaneously numerous I/O pull-down devices in each of a large number of integrated circuits on a wafer. Most of these same steps are also used in the formation of logic circuits in the same integrated circuits.

BRIEF DESCRIPTION OF DRAWING

These and other objects features and advantages of the invention will be more readily apparent from the following Detailed Description in which:

FIG. 7 is a top view of a second part of the first embodiment of the circuit of FIG. 4;

FIG. 8 is a cross-sectional view of the embodiment of FIG. 7 along the line 8-8;

FIG. 9 is a top view of an alternative second part of the first embodiment of the circuit of FIG. 4;

FIG. 10 is a cross-sectional view of the embodiment of FIG. 9 along the line 10-10;

DETAILED DESCRIPTION

Figure 1:
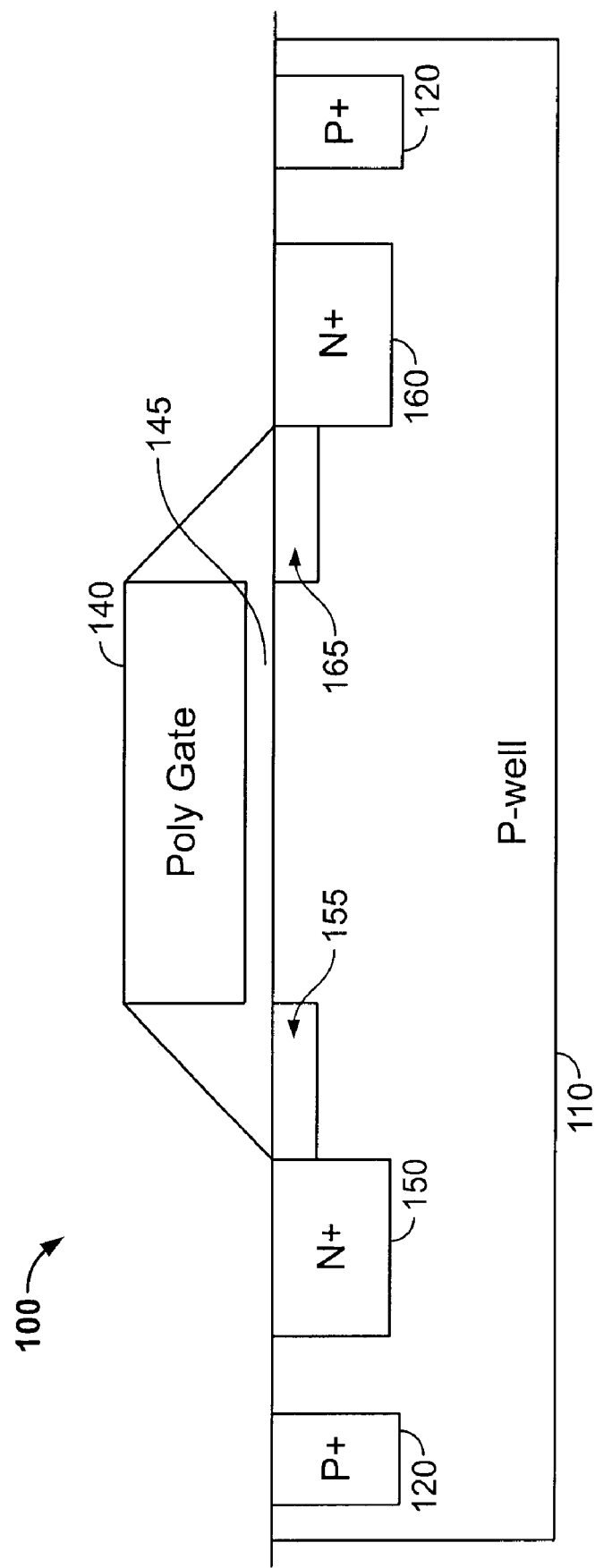
FIG. 1 is a cross-sectional view of a conventional I/O pull-down device.
Figure 4:
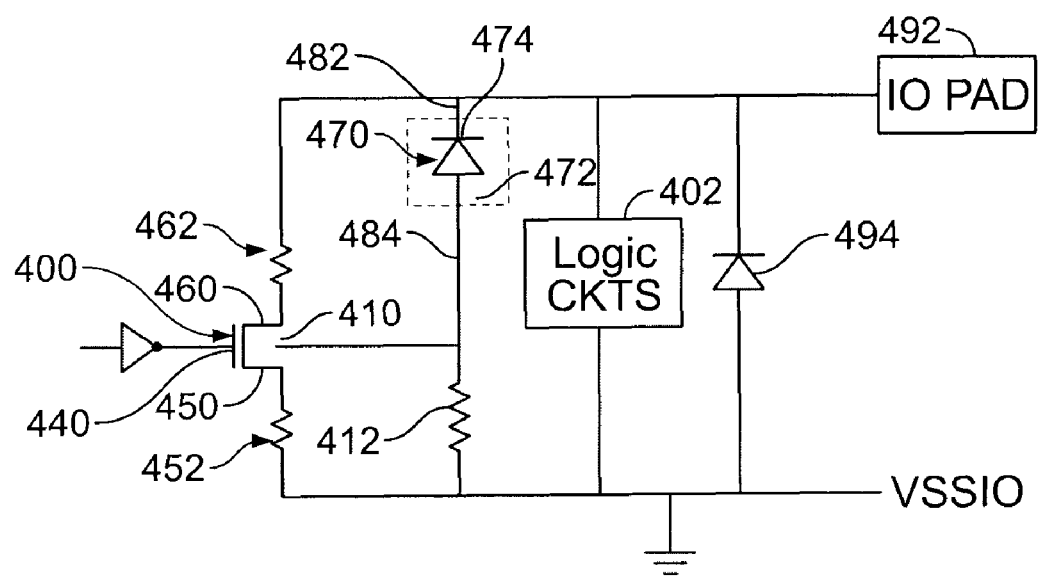
FIG. 4 is a circuit schematic for a preferred embodiment of the present invention.

FIG. 4 is a circuit schematic depicting the use of an illustrative embodiment of an ESD protection device of the present invention in a typical input/output circuit. The ESD protection device comprises a transistor device 400 and a diode 470. Transistor device 400 is similar to device 100 of FIG. 1 and its components bear the same numbers increased by 300. Thus, transistor device 400 comprises a P-well or body 410, a polysilicon gate 440 on the substrate and insulated therefrom, heavily doped N-type source and drain regions 450, 460 and N-type LDD regions (not identified in FIG. 4). Diode 470 comprises an anode 472 and a cathode 474. Transistor 400 is connected between an I/O pad 492 and ground $V_{SSIO}$. Illustratively, a first ballast resistor 462 is connected between drain 460 of transistor 400 and I/O pad 492 and a second ballast resistor 452 is connected between source 450 of transistor 400 and ground. P-well or P-type substrate or body 410 of device 100 is connected to ground. Ballast resistors 452, 462 are used to provide a more uniform current distribution through transistor 400. Alternatively, a salicide block could be used. The resistance of the P-type body is represented in the schematic by resistor 412. Diode 470 is connected by leads 482, 484 between the I/O pad 492 and body 410 of transistor 400 with its cathode connected to I/O pad 492 and its anode connected to body 410. A diode 494 is connected between I/O pad 492 and ground with its cathode connected to the I/O pad and its anode connected to ground. Diode 494 is used to discharge negative voltage electrostatic events.

Several alternatives have been device for implementing the circuit of FIG. 4.

Figures 5, 6:
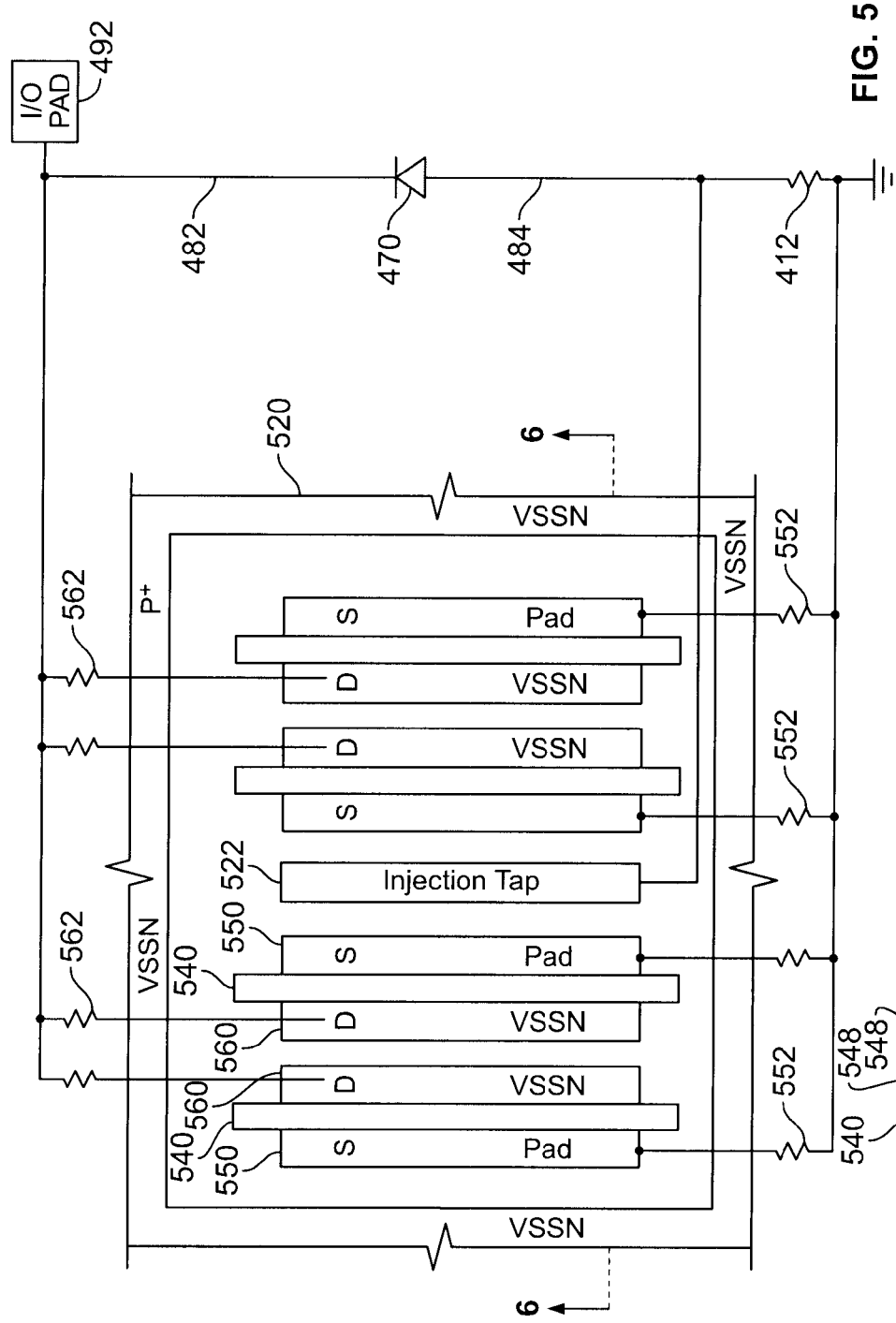
FIG. 5 is a top view of a first part of a first embodiment of the circuit of FIG. 4.
FIG. 6 is a cross-sectional view of the embodiment of FIG. 5 along the line 6-6.

FIG. 5 is a top view of a first part of a first embodiment of the ESD protection device of FIG. 4. Transistor device 400 is formed in a first portion of a semiconductor substrate 505. A P-well 510 is formed in that portion and electrical connection to the P-well is made through P+ well tap 520. Illustratively, the P-well tap extends around the entire periphery of P-well 510. An additional P+ well tap 522 extends through the center of the P-well. A plurality of shallow trench isolations (STI) 530 best shown in FIG. 6 divide the area encompassed by P-well taps 520 into regions 535. A plurality of NMOS transistors are formed in the P-well, one in each region 535, each transistor having a gate finger 540 and N+ source and drain regions 550, 560, respectively, on opposite sides of the gate finger. While not shown in FIG. 5, N-type lightly doped drain (LDD) regions extend toward each other from the source and drain regions 550, 560 on both sides of each gate finger 540.

To avoid unnecessary complexity in FIG. 5, conventional contacts to the source and drain regions 550, 560 and the connections of the gate fingers 540 have not been shown. Rather, the connections of drain regions 560 through ballast resistors 562 to I/O pad 492 and the connection of source regions 550 through ballast resistors 552 to ground are schematically shown. As will be apparent, the transistors are all connected in parallel between the I/O pad and ground. Likewise, diode 470 is represented schematically with its cathode connected to I/O pad 492 and its anode to the center tap 522 in P-well 510. Further details of alternative embodiments of diode 470 are set forth in FIGS. 7-10.

FIG. 6 depicts a cross-section of transistor device 400 taken along lines 6-6 in FIG. 5. As shown in FIG. 6, device 400 comprises a P-well 510 in a substrate 505, P+ taps 520, 522, STI 530, gate fingers 540 and heavily doped N+ source and drain regions 550, 560. Gate fingers 540 are insulated from P-well 510 by gate oxide 545. On both sides of each gate 540 are sidewalls 548. Extending from each source/drain region toward the other source/drain region are first and second N-type lightly doped drain (LDD) regions 555, 565. Illustratively, the P-type dopant is boron and the N-type dopant is phosphorous, arsenic or antimony.

FIG. 7 is a top view and FIG. 8 is a cross-sectional view along line 8-8 of FIG. 7 of a second part of the first embodiment of the ESD protection device of FIG. 4. Diode 470 is formed in a second portion of semiconductor substrate 505 isolated from the first portion. A P-well 710 and an N-well 715 are formed in the second portion. Electrical connection to the P-well is made through P+ well taps 720 and salicide layer 722. Electrical connection to the N-well is made through N+ well taps 725 and salicide layer 727. The diode is formed at the junction between an N+ layer 750 and P-type LDD layer 760. The N+ layer, which is the cathode of the diode, is connected through salicide layer 754 and lead 482 to I/O pad 492 as shown in FIG. 5. The P-type LDD layer, which is the anode of the diode, is connected by lead 484 to the body 510 of transistor device 400 through center tap 522 of FIG. 5. A salicide block 754 prevents the formation of a salicide layer at junction 752 that would short-circuit the junction. Shallow trench isolation (STI) regions 730 define a central region 735 and peripheral regions 736, 737 on the surface of the P-well and isolate the P+ well taps 720, N+ well taps 725, and P-type LDD layer 760. Details of the fabrication of the device of FIGS. 5 to 8 are set forth below in conjunction with FIG. 17.

FIG. 9 is a top view and FIG. 10 is a cross-sectional view along line 10-10 of FIG. 9 of an alternative second part of the first embodiment of the ESD protection device of FIG. 4. Again, diode 470A is formed in a second portion of semiconductor substrate 505 isolated from the first portion. A P-well 910 and an N-well 915 are formed in the second portion. Electrical connection to the P-well is made through P+ well taps 920 and salicide layer 922. Electrical connection to the N-well is made through N+ well taps 925 and salicide layer 927. The diode is formed at the junction between an N+ layer 950 and an implanted P-layer 960. The N+ layer, which is the cathode of the diode, is connected through salicide layer 954 and lead 482 to I/O pad 492 as shown in FIG. 5. The P-layer, which is the anode of the diode, is connected to the body 510 of transistor device 400 through P-well 910, P+ well taps 920, salicide layer 922, lead 484 and center tap 522 as shown in FIG. 5. Shallow trench isolation (STI) regions 930 define a central region 935 and peripheral regions 936, 937 on the surface of the P-well and isolate the P+ well taps 920, N+ well taps 925, and N+ layer 950. Details of the fabrication of the device of FIGS. 5, 6, 9 and 10 are set forth below in conjunction with FIG. 18.

Figure 11:
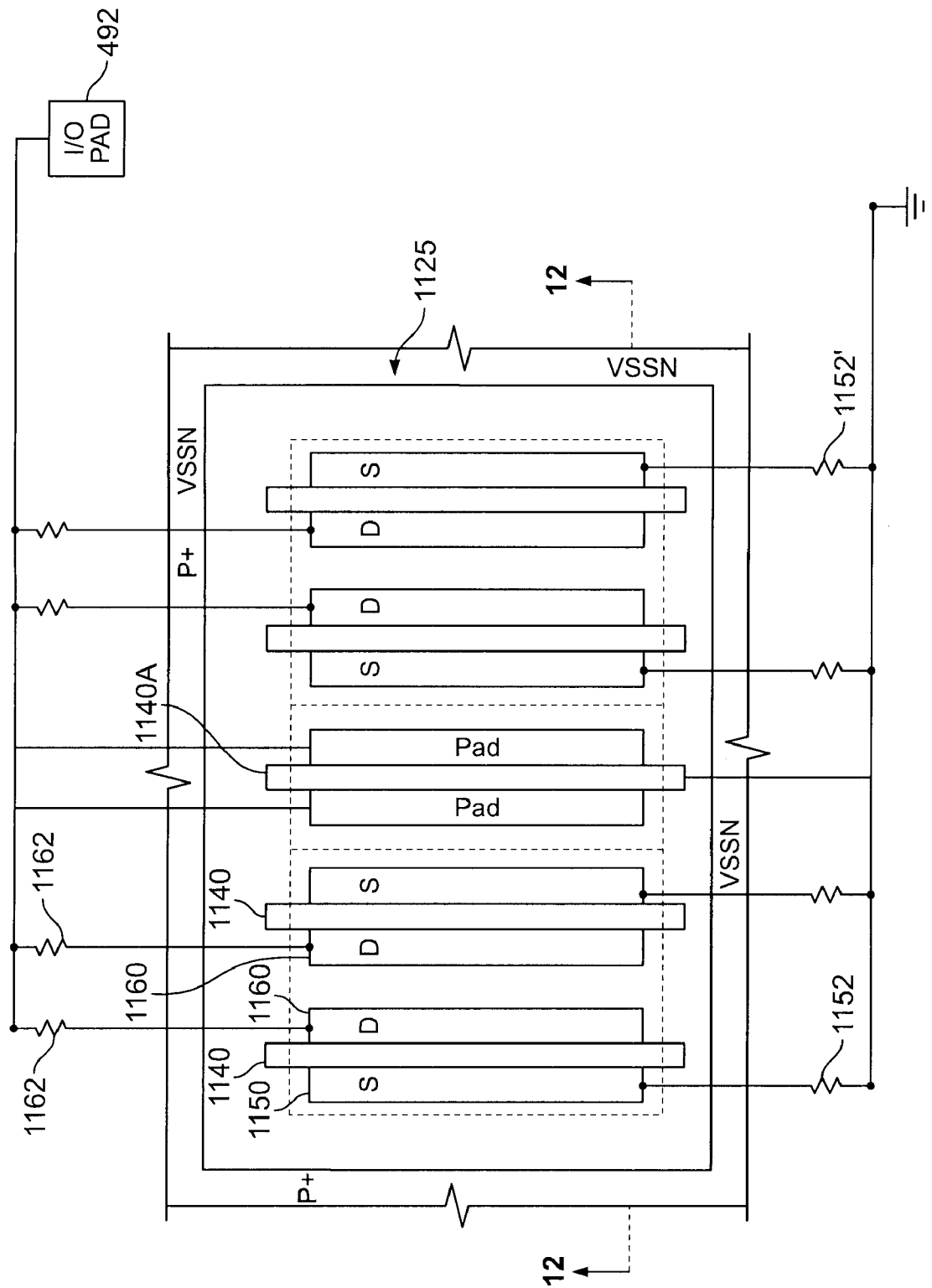
FIG. 11 is a top view of a second embodiment of the circuit of FIG. 4.

FIG. 11 is a top view of a second embodiment of the ESD protection device of FIG. 4. In this embodiment, the transistor and the diode are formed in the same portion of a well. A P-well 1110 is formed in a substrate. A P+ ring 1125 that preferably extends around the entire periphery of P-well 1110 provides contact to P-well 1110. Ring 1125 is connected to ground. A plurality of STI 1130 divide the area encompassed by guardring 1125 into regions 1135. A plurality of NMOS transistors are formed in the P-well, one in each region, each transistor having a gate finger 1140 and N+ source and drain regions 1150, 1160, respectively, on opposite sides of the gate finger. While not shown in FIG. 11, N-type LDD regions extend toward each other from the source and drain regions 1150, 1160 on both sides of each gate finger 1140.

To avoid unnecessary complexity in FIG. 11, conventional contacts to the source/drain regions 1150, 1160 and the connections of the gate fingers 1140 have not been shown. Rather, the connections of drain regions 1160 through ballast resistors 1162 to I/O pad 492 and the connection of source regions 1150 through ballast resistors 1152 to ground are schematically shown. As will be apparent, the transistors are all connected in parallel between the I/O pad and ground.

Figure 12:
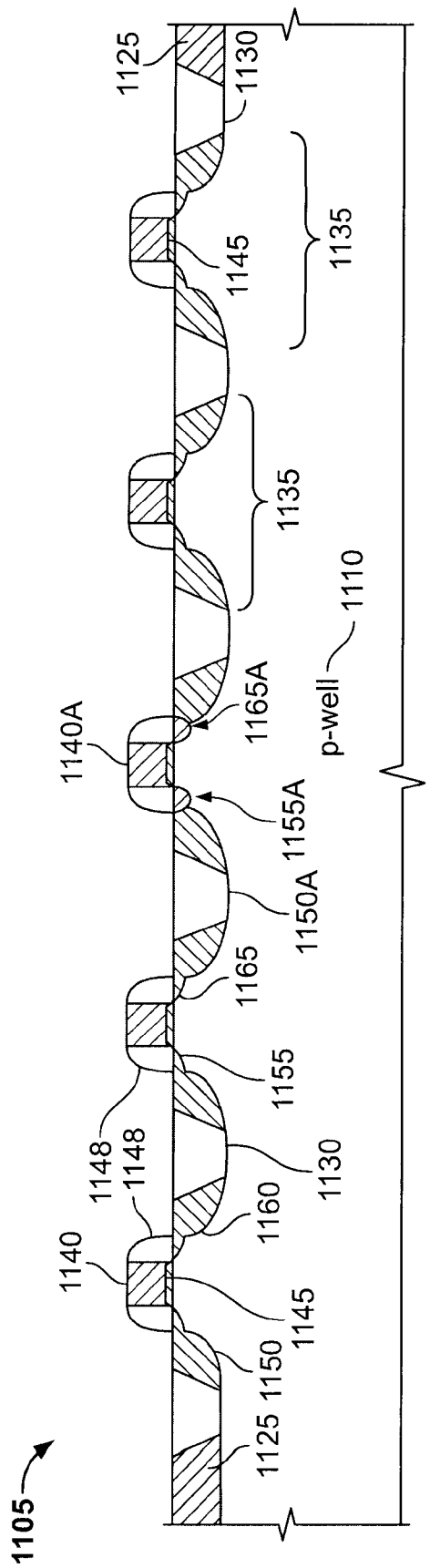
FIG. 12 is a cross-sectional view of the embodiment of FIG. 11 along the line 12-12.

An additional gate finger 1140A is formed at the same time gate fingers 1140 are formed and the diode is formed in the P-well adjacent gate finger 1140A. FIG. 12 depicts a cross-section of one embodiment of transistor device 400 taken along lines 12-12 in FIG. 11. As shown in FIG. 12, device 400 comprises a P-well 1110 in a substrate 1105, P+ guardring 1125, STI 1130, gate fingers 1140 and 1140A and heavily doped N+ source and drain regions 1150, 1160. Gate fingers 1140 and 1140A are insulated from P-well 1110 by gate oxide 1145. On both sides of each gate 1140 and 1140A are sidewalls 1148. Extending from each source/drain region toward the other source/drain region are first and second N-type LDD regions 1155, 1165. Again, the P-type dopant illustratively is boron and the N-type dopant is phosphorous, arsenic or antimony.

The structure in the well on either side of gate finger 1140A is similar to that underneath gate fingers 1140 in that it includes heavily doped N+ regions 1150A and 1160A on opposite sides of gate finger 1140A. However, in place of the N-type LDD regions 1155 and 1165 underneath gate fingers 1140, there are P-type LDD regions 1155A and 1165A. These regions form an N+/PLDD diode with heavily doped N+ regions 1150A and 1160A. The N+ regions 1150A and 1160A, which constitute the cathode of the diode, are connected by lead 482 to I/O pad 492 as shown in FIG. 5. The P-type LDD regions 1155A and 1165A, which are the anode of the diode, are formed in P-well 1110 and are in electrical contact with it.

Figure 13:
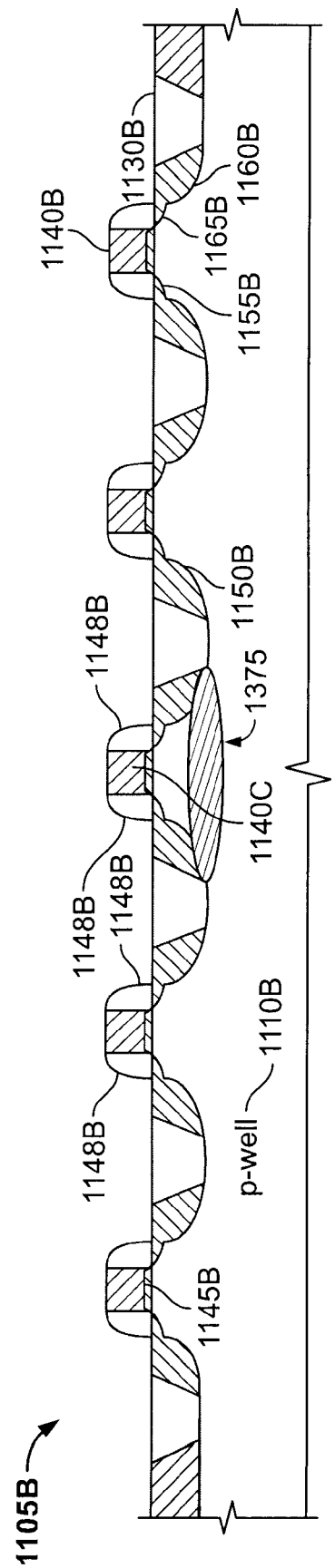
FIG. 13 is a cross-sectional view of an alternative embodiment of FIG. 11 along the line 12-12.

FIG. 13 depicts a cross-section of an alternative embodiment of the device of FIG. 11 also along lines 12-12 of FIG. 11. As shown in FIG. 13, device 400 comprises a P-well 1110B in a substrate 1105B, gate fingers 1140B and 1140C and heavily doped N+ source and drain regions 1150B and 1160B. Gate fingers 1140B and 1140C are insulated from P-well 1110B by gate oxide 1145B. On both sides of each gate 1140B and 1140C are sidewalls 1148B. Extending from each source/drain region toward the other source drain region are first and second N-type LDD regions 1155B and 1165B.

In this embodiment, the structure in the well on either side of gate finger 1140C is the same as that under gate fingers 1140B except that a P region 1375 is implanted in P-well 1110B adjacent the N+ source and drain regions on either side of gate finger 1140C. A $N_+/P$ diode is formed at the junction between these N+ regions and P region 1375. The N+ regions, which constitute the cathode of the diode, are connected by lead 482 to I/O pad 492 as shown in FIG. 5. The P region 1375, which is the anode of the diode, is formed in P-well 1110B and is in electrical contact with it.

Figure 14:
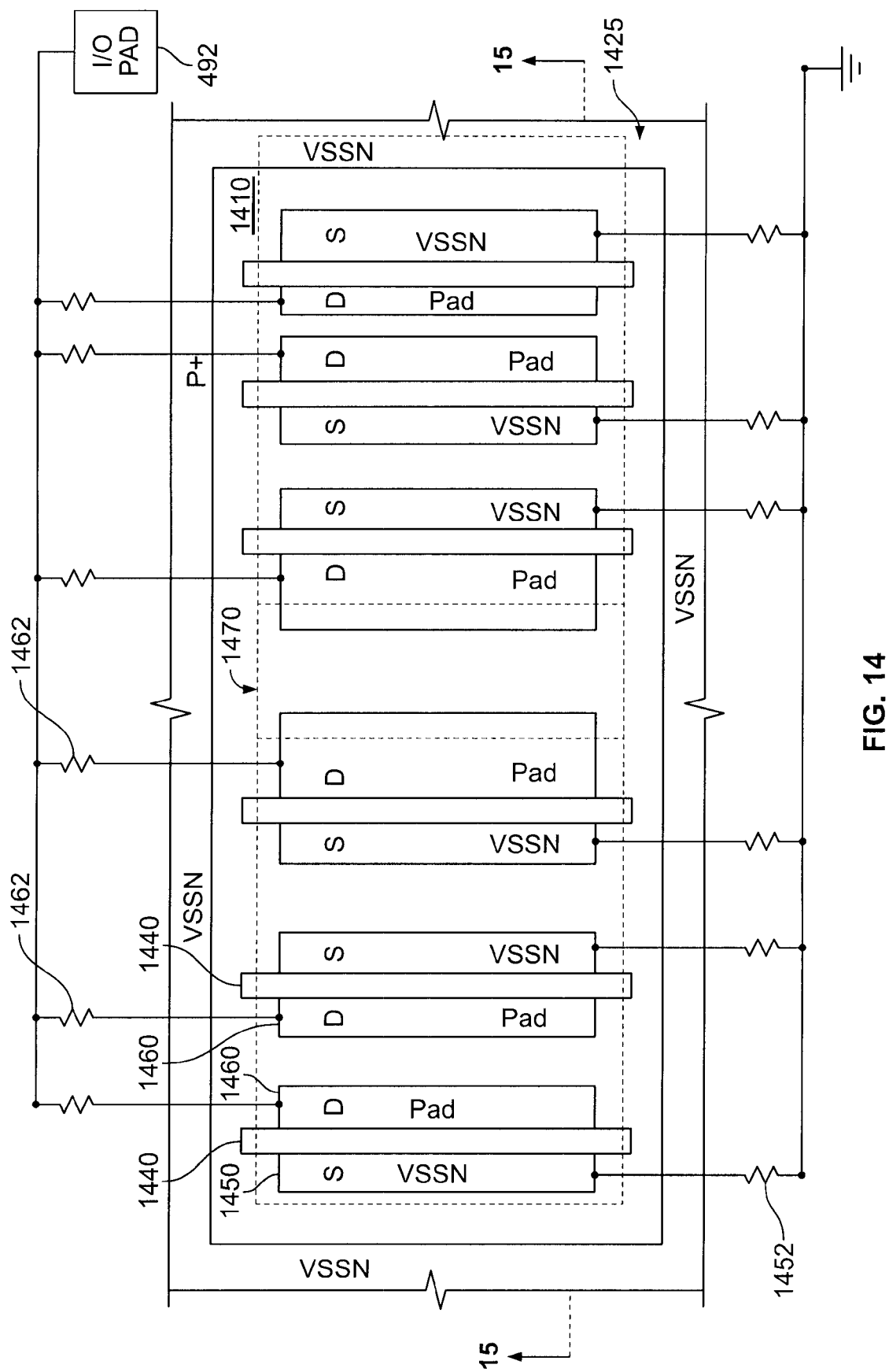
FIG. 14 is a top view of a third embodiment of the circuit of FIG. 4.

FIG. 14 is a top view of a third embodiment of the ESD protection device of FIG. 4. Transistor device 400 is formed in a semiconductor substrate 1405. A P-well 1410 is formed in that portion. A P+ ring 1425 that preferably extends around the entire periphery of P-well 1410 provides contact to P-well 1410. Ring 1425 is connected to ground. A plurality of STI 1430 divide the area encompassed by guardring 1425 into regions 1435. A plurality of NMOS transistors are formed in the P-well, each having a gate finger 1440 and N+ source and drain regions 1450, 1460, respectively, on opposite sides of the gate finger. While not shown in FIG. 14, N-type LDD regions extend toward each other from the source and drain regions 1450, 1460 on both sides of each gate finger 1440. The top view of FIG. 14 differs from that of FIGS. 5 and 11 in that the diode is formed in region 1470 between two of the transistor structures as described below.

To avoid unnecessary complexity in FIG. 14, conventional contacts to the source/drain regions 1450, 1460 and the connections of the gate fingers 1440 have not been shown. Rather, the connections of drain regions 1460 through ballast resistors 1462 to I/O pad 492 and the connection of source regions 1450 through ballast resistors 1452 to ground are schematically shown. As will be apparent, the transistors are all connected in parallel between the I/O pad and ground.

Figure 15:
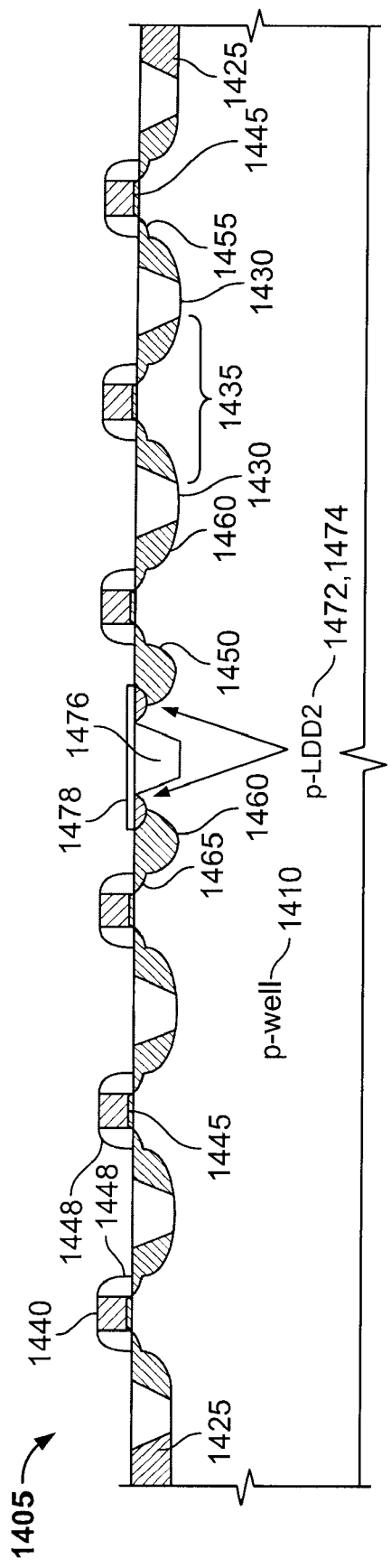
FIG. 15 is a cross-sectional view of the embodiment of FIG. 14 along the line 12-12.

FIG. 15 depicts a cross-section of one embodiment of transistor device 400 taken along lines 15-15 in FIG. 14. As shown in FIG. 15, device 400 comprises a P-well 1410 in a substrate 1405, guardring 1425, gate fingers 1440 and heavily doped N+ source and drain regions 1450, 1460. Gate fingers 1440 are insulated from P-well 1410 in substrate 1405 by gate oxide 1445. On both sides of each gate 1440 are sidewalls 1448. Extending from each source/drain region toward the other source/drain region are first and second N-type LDD regions 1455, 1465. Again, the P-type dopant illustratively is boron and the N-type dopant is phosphorous, arsenic or antimony.

The structure in the well in region 1470 comprises two P-type LDD regions 1472, 1474 separated by a STI 1476. The P-type LDD regions form an N+/PLDD diode with heavily doped N+ regions 1460. The N+ regions 1460, which constitute the cathode of the diode, are connected by lead 482 to I/O pad 492 as shown in FIG. 5. The P-type LDD regions 1472, 1474, which are the anode of the diode, are formed in P-well 1410 and in electrical contact with it. A salicide block 1478 is formed on the surface over the diodes to prevent the formation of a salicide layer that would short-circuit the N+/PLDD junctions of the diodes.

Figure 16:
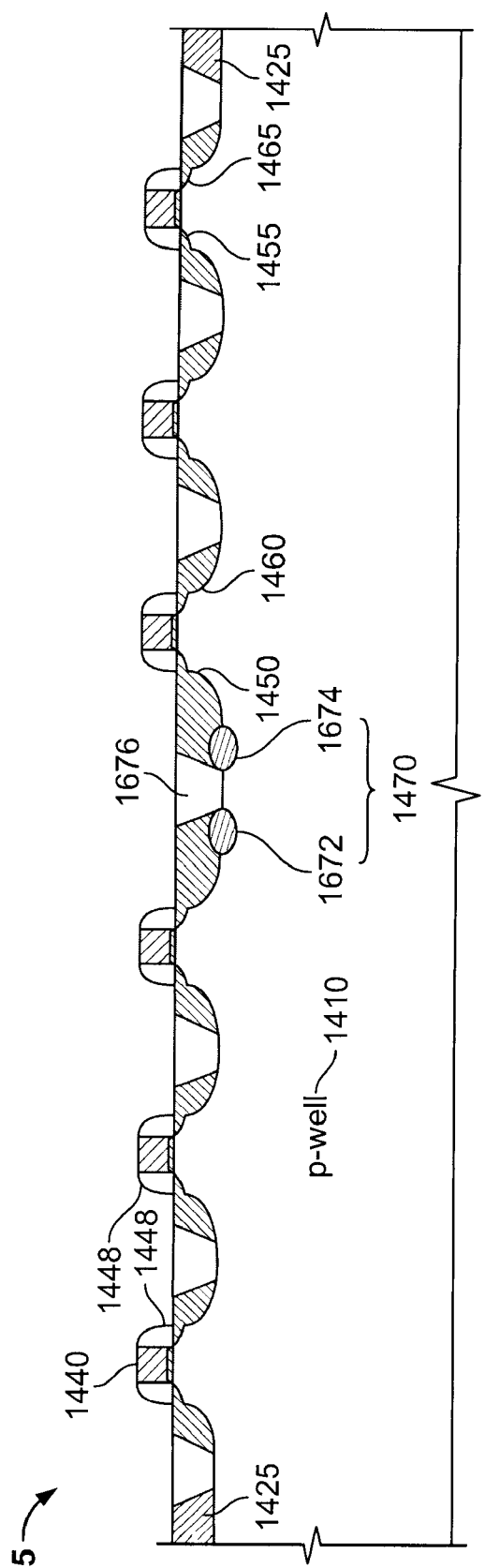
FIG. 16 is a cross-sectional view of an alternative embodiment of FIG. 14 along the line 12-12.

FIG. 16 depicts a cross-section of an alternative embodiment of transistor device 400 also along lines 15-15 of FIG. 14. As shown in FIG. 16, device 400 comprises a P-well 1410 in a substrate 1405, P+ taps 1420, gate fingers 1440 and heavily doped N+ source and drain regions 1450 and 1460. Gate fingers 1440 are insulated from P-well 1410 by gate oxide 1445. On both sides of each gate 1440 are sidewalls 1445. Extending from each source/drain region toward the other source/drain region are first and second N-type LDD regions 1455 and 1465.

In this embodiment, the structure in the well beneath gap 1470 comprises two P-type implants 1672, 1674 separated by an STI 1676. The P-type implants form a N+P diode at the junction between the P-type implants and N+ regions 1450, 1460. The N+ regions, which constitute the cathode of the diode, are connected by lead 482 to I/O pad 492 as shown in FIG. 5. The P-type implants, which are the anode of the diode, are formed in P-well 1410 and are in electrical contact with it.

Figure 17:
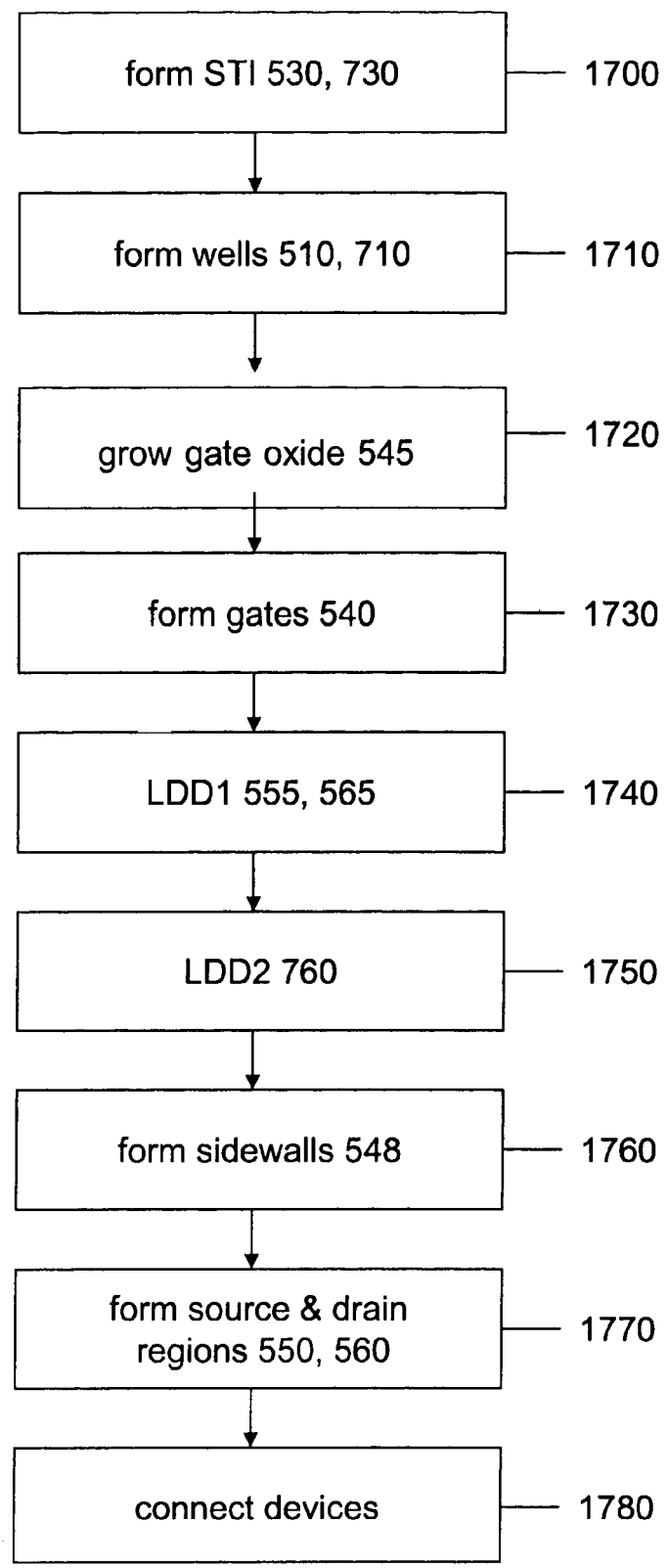
FIG. 17 is a flowchart depicting an illustrative process for forming the embodiment of FIGS. 5 through 8.

An illustrative method for forming the device of FIGS. 5-8 is shown in the flowchart of FIG. 17. At step 1700, the surface of the substrate is divided by shallow trench isolations (STIs) 530. At step 1710, separate wells 510, 710 of a first conductivity type are formed. In the case of the first well 510 in which the pull-down device is formed, the STIs 530 circumscribe the areas where the transistors are to be formed so as to divide the surface of the well into a plurality of parallel regions. In the case of the second well 710 in which the trigger device is formed, the STIs 730 are concentric rectangles as shown in FIGS. 7 and 8 so as to divide the surface into a central region 735 and peripheral regions 736, 737 surrounding the central region but separated therefrom. At step 1720, an oxide layer 545 is then grown on the surface of each well; and at step 1730, a gate 540 is formed in each of the parallel regions of the first well. Next, the first well is lightly doped at step 1740 on both sides of each gate with a dopant of a second (or opposite) conductivity type to form LDD regions 555, 565; and the second well is lightly doped at step 1750 with a dopant of the first conductivity type to form LDD region 760 throughout the entire region inside peripheral region 736. Preferably, each lightly doping step is performed at the same time and therefore with the same dopant concentration as LDD regions of that conductivity type are doped in other parts of the integrated circuit. As will be apparent by those skilled in the art, the second well is masked during doping of the first well and the first well is masked during doping of the second.

Sidewalls 548 are then formed at step 1760 on each of the gates of the first well. Then, the first well is heavily doped at step 1770 on both sides of each gate with dopant of the second conductivity type so as to form source and drain regions 550, 560 from which the lightly doped regions extend. Simultaneously, the second well is heavily doped in a portion 750 of the central region 735 with a dopant of the second conductivity type so as to form a P/N junction at the interface between the heavily doped portion 750 of the central region and the remainder of the central region that previously was lightly doped with a dopant of first conductivity type. Preferably, as shown in FIGS. 7 and 8, the heavily doped portion 750 is a rectangular region that fits inside central region 735, thereby providing a substantial lateral extent for the P/N junction. As a result, a plurality of MOS transistors of the second conductivity type are formed in the first well; and, where the heavily doped region of second conductivity type contacts the lightly doped region of first conductivity type in the second well, a diode is formed that is heavily doped on one side of its P/N junction and lightly doped on the other. At step 1780, the diode is then connected between the I/O pad to be protected and the body of the pull-down device.

Preferably, the first conductivity type is P-type and the second conductivity type is N-type so that the wells are P-wells, the transistors are NMOS transistors and the cathode of the diode is connected to the I/O pad and the anode to the first P-well.

Figure 18:
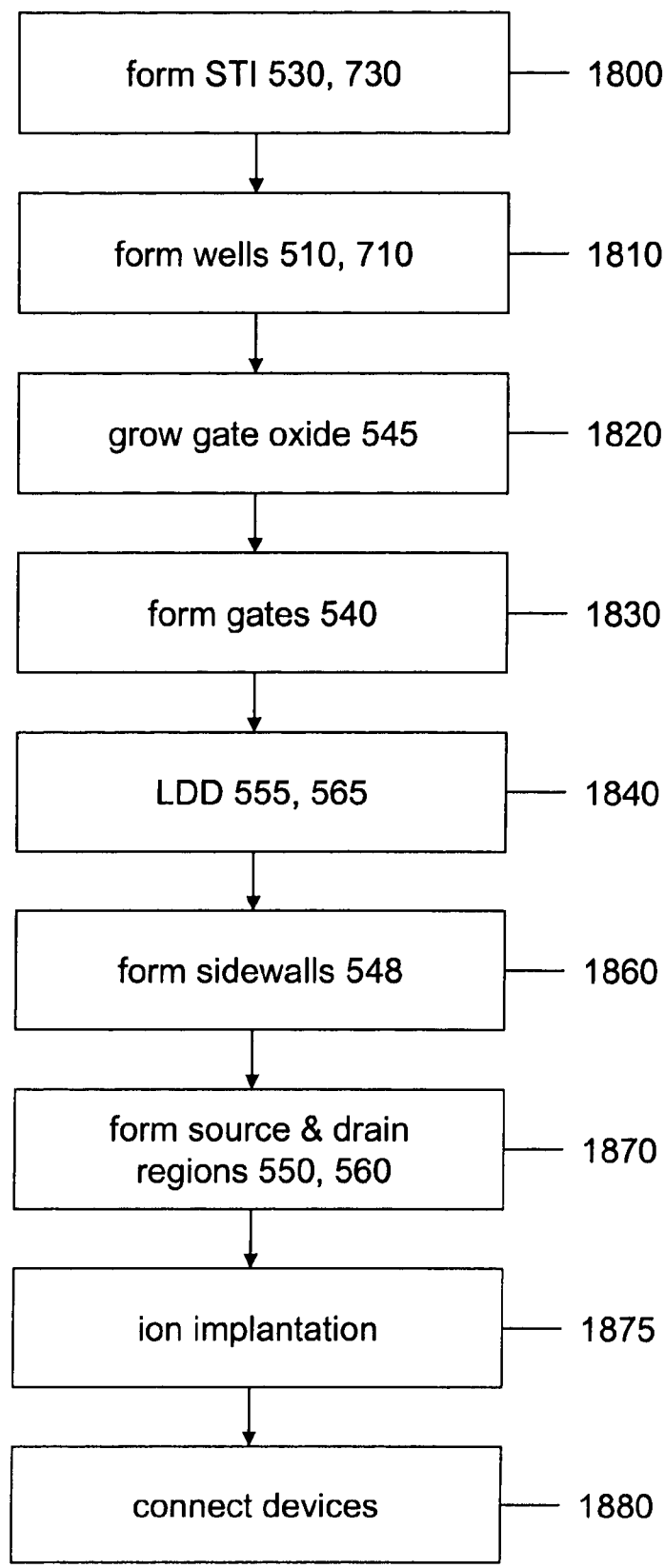
FIG. 18 is a flowchart depicting an illustrative process for forming the embodiment of FIGS. 5, 6, 9 and 10.

In an alternative embodiment, the diode may be formed in the second well using an implanted region of first conductivity type instead of a lightly doped region of first conductivity type. In this alternative, as shown in FIG. 18, the steps are the same as those of FIG. 17 but no lightly doped region is formed in the second well. Rather, at step 1870 during formation of the source and drain regions in the first well, the entire central region 935 on the surface of the second well is heavily doped with the dopant of second conductivity type to form a heavily doped region 950 of second conductivity type. Then, at step 1875, a region 960 of first conductivity type is formed underneath this region but in contact with it by implanting ions of the first conductivity type. As a result, a P/N junction diode is formed at the interface between the heavily doped region of second conductivity type and the ion implanted region of first conductivity type. The diode is then connected at step 1880 between the I/O pad to be protected and the body of the pull-down device.

Figure 19:
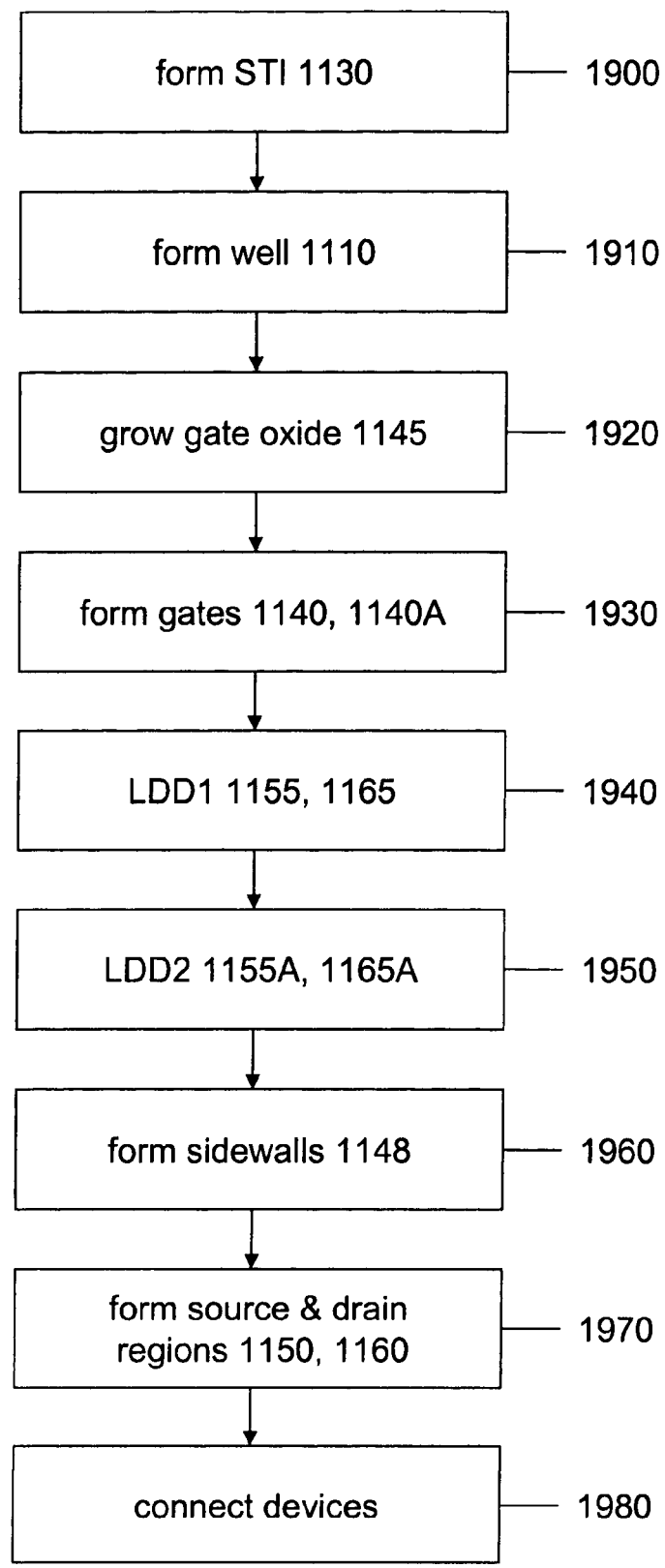
FIG. 19 is a flowchart depicting an illustrative process for forming the embodiment of FIGS. 11 and 12.

An illustrative method for forming the single well embodiment of the device of FIGS. 11 and 12 is shown in FIG. 19. As will be apparent, the sequence of step is the same as in FIG. 17 but in this case the steps are performed on a single well 1110. At step 1900, the surface of a semiconductor substrate is divided into a series of parallel regions by a plurality of shallow trench isolations (STI) 1130 that circumscribe the areas where the transistors are to be formed. At step 1910, a well 1110 of a first conductivity type is formed. At step 1920, an oxide layer 1145 is then grown on the surface of the well; and at step 1930, a gate 1140 is then formed in each of the regions defined by the STIs. Next, at step 1940, the well is lightly doped on both sides of all but one gate with a dopant of a second conductivity type to form LDD regions 1155, 1165; and at step 1950, the well is lightly doped on both sides of the remaining gate 1140A with a dopant of the first conductivity type to form LDD regions 1155A and 1165A. As will be appreciated by those skilled in the art, the region surrounding gate 1140A is masked during step 1940 and everything except the region surrounding gate 1140A is masked during step 1950.

Sidewalls 1148 are then formed at step 1960 on each of the gates. Then, the well is heavily doped at step 1970 on both sides of each gate with dopant of the second conductivity type so as to form source and drain regions 1150, 1160 from which the lightly doped drain regions extend. As a result, a plurality of MOS transistors are formed of the second conductivity type. In addition, where the heavily doped source and drain regions of second conductivity type contact lightly doped regions of the first conductivity type, a diode is formed that is heavily doped on one side of its P/N junction and lightly doped on the other. At step 1980, the heavily doped side of the diode is then connected to the I/O pad. The lightly doped side is in direct contact with the well in which the MOS transistors are formed. The gate over the diode is not connected to the other diodes but rather is grounded.

Figure 20:
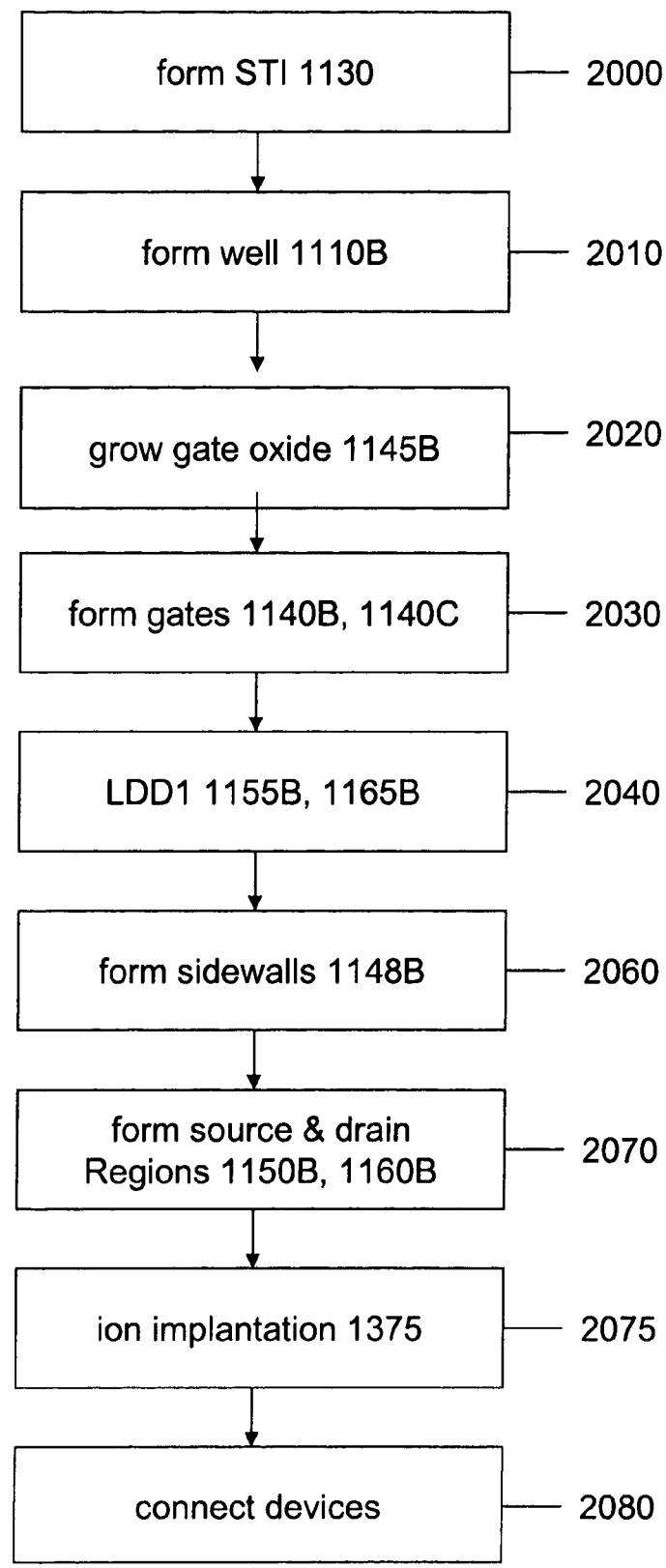
FIG. 20 is a flow chart depicting an illustrative process for forming the embodiment of FIGS. 11 and 13.

An alternative method for forming the single well embodiment of FIGS. 11 and 13 does not use a lightly doped region of a first conductivity type. As shown in FIG. 20, the same process steps as described above in conjunction with FIG. 19 are followed through formation at step 2030 of gates 1140B, 1140C in each of the regions defined by the STIs. Next, at step 2040 the well 1110B is lightly doped on both sides of each gate 1140B, 1140C with a dopant of a second conductivity type to form LDD regions 1155B, 1165B. Sidewalls 1148B are then formed at step 2060 on each of the gates. Then, the well is heavily doped at step 1270 on both sides of each gate 1140B, 1140C with dopant of the second conductivity type so as to form source and drain regions 1150B, 1160B from which the lightly doped drain regions 1155B, 1165B extend. A region 1375 of first conductivity type is formed at step 2075 underneath but in contact with the source and drain regions on opposite sides of one gate 1140C by implanting ions of a first conductivity type. As a result, a plurality of MOS transistors of the second conductivity type are formed at those gates where ion implantation does not take place. In addition, where the heavily doped source and drain regions of second conductivity type contact the ion implanted region of the first conductivity type, a P/N junction diode is formed. The ion implanted side of the diode is in direct contact with the well in which the MOS transistors are formed. The other side is connected at step 2080 to the I/O pad.

Figure 21:
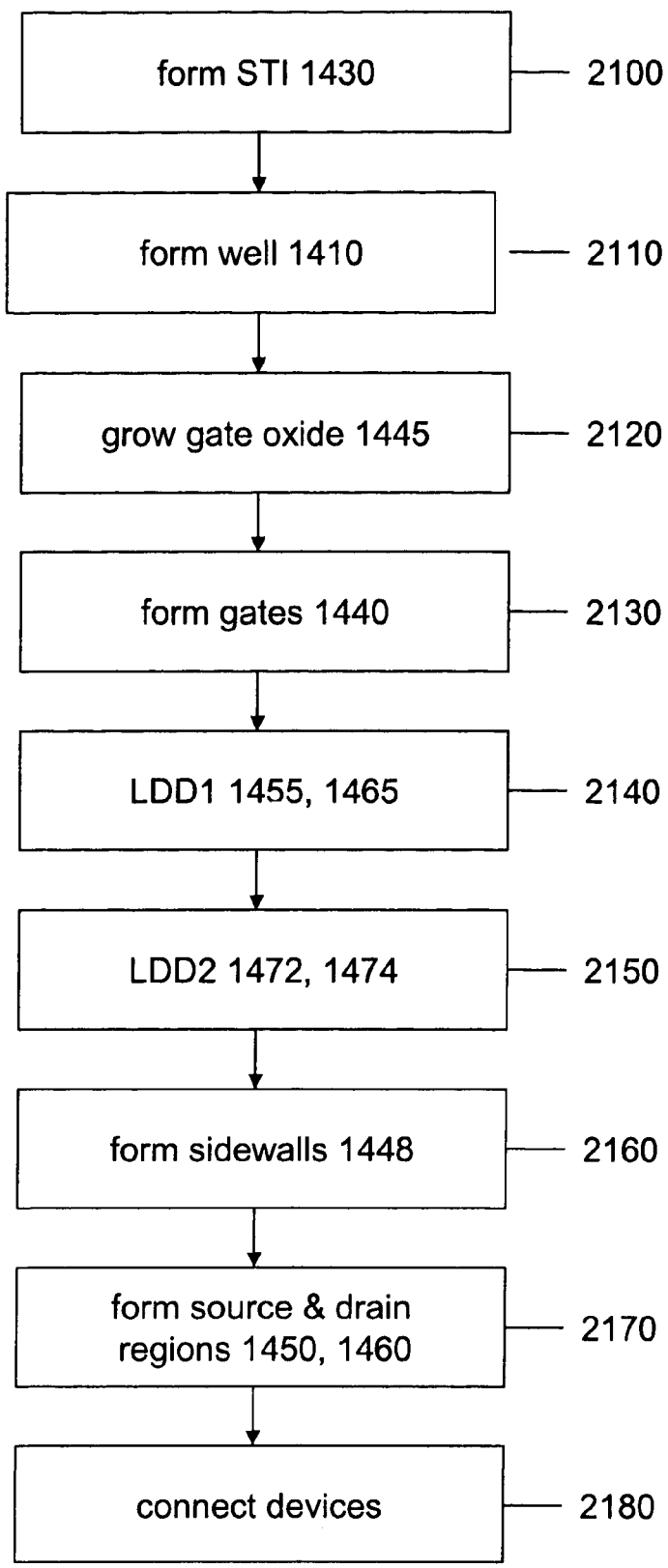
FIG. 21 is a flow chart depicting an illustrative process for forming the embodiment of FIGS. 14 and 15.

An illustrative method for forming the device of FIGS. 14 and 15 of the present invention is shown in FIG. 21. In this embodiment, a trigger diode is formed in a part of the well, preferably the center, where a transistor otherwise would have been formed. As will be apparent, the sequence of processing steps are the same as in FIGS. 17 and 19 except for the effects produced by certain masking operations. At step 2100, the surface of the oxide layer of the well is divided into a series of parallel regions by a plurality of shallow trench isolations (STI) 1430 that circumscribe the areas where the transistors are to be formed. At step 2110, a well 1410 of a first conductivity type is formed. At step 2120, an oxide layer 1445 is then grown on the surface of the well; and a gate 1440 is then formed at step 2130 in each of the regions defined by the STIs. Next, the well is lightly doped at step 2140 on both sides of each gate with a dopant of a second conductivity type to form LDD regions 1455 and 1465; and the well is lightly doped where the diode is to be formed with a dopant of the first conductivity type to form LDD regions 1472, 1474. This is accomplished by masking the area where the diode is to be formed when doping with dopants of the second conductivity type and masking everything but the area where the diode is to be formed when doping with dopants of the first conductivity type.

Sidewalls 1448 are then formed at step 2160 on each of the gates. Then, the well is heavily doped at step 2170 on both sides of each gate with dopant of the second conductivity type so as to form source and drain regions 1450, 1460 from which the lightly doped drain regions 1455, 1465 of second conductivity type extend. Again, the region where the diode is to be formed is masked during the doping step. As a result, a plurality of MOS transistors of the second conductivity type are formed. In addition, where the heavily doped source and drain regions of second conductivity type contact lightly doped regions 1472, 1474 of the first conductivity type, a diode is formed that is heavily doped on one side of its P/N junction and lightly doped on the other. The heavily doped side of the diode is then connected at step 2180 to the I/O pad. The lightly doped side is in direct contact with the well in which the MOS transistors are formed.

Figure 22:
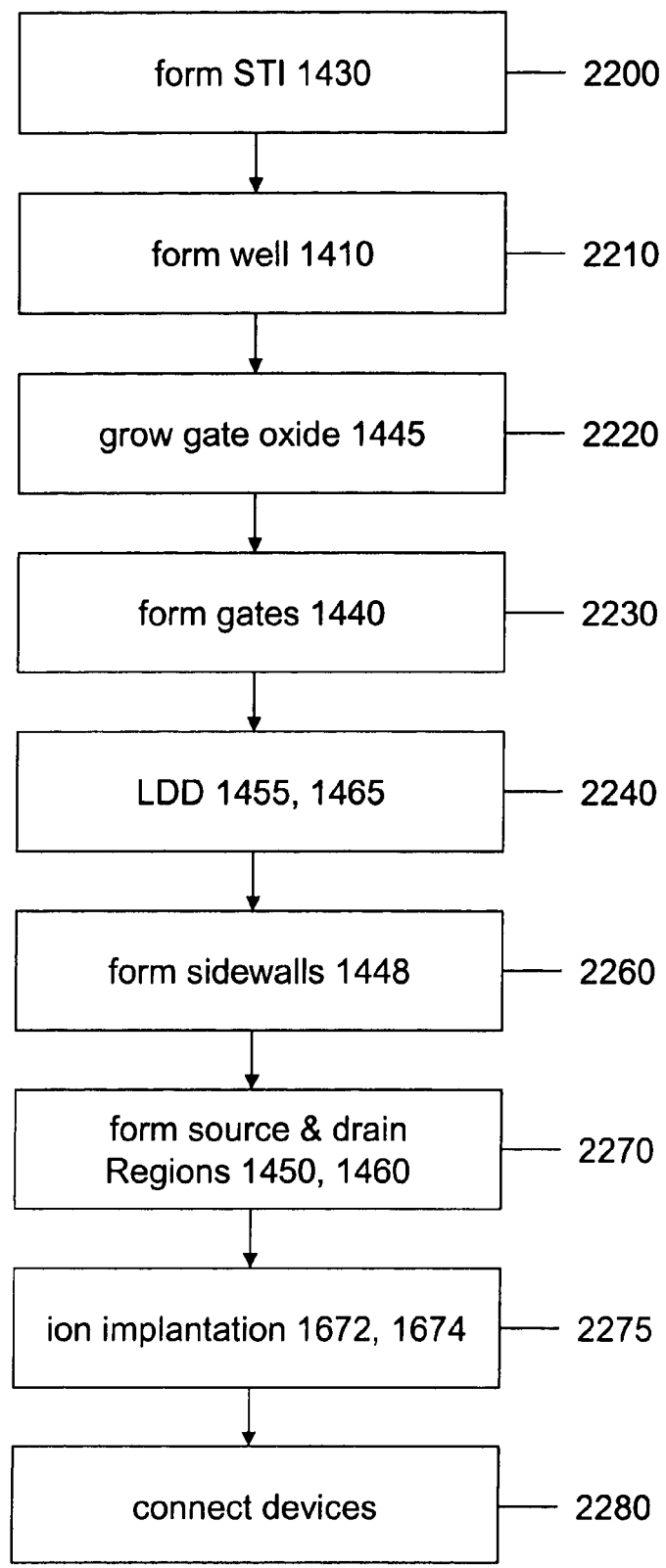
FIG. 22 is a flow chart depicting an illustrative process for forming the embodiment of FIGS. 14 and 16.

A method for forming the alternative embodiment of FIGS. 14 and 16 does not use a lightly doped region of a first conductivity type. As shown in FIG. 22, the same process steps described above in conjunction with FIG. 21 are followed through formation at step 2230 of gate 1440 in each of the regions defined by the STIs. Next, at step 2240, the well 1410 is lightly doped on both sides of each gate with a dopant of a second conductivity type to form LDD regions 1455, 1465. Sidewalls 1448 are then formed at step 2260 on each of the gates. Then, the well is heavily doped at step 2270 on both sides of each gate with a dopant of the second conductivity type so as to form source and drain regions 1450, 1460 from which the lightly doped drain regions 1455, 1465 extend. At least one region and preferably two regions 1672, 1674 of first conductivity type are formed at step 2275 underneath and in contact with the source and/or drain regions by implanting ions of a first conductivity type. As a result, a plurality of MOS transistors are formed of the second conductivity type. In addition, where the heavily doped source and drain regions of second conductivity type contact lightly doped regions of the first conductivity type, a diode is formed. The heavily doped side of the diode is then connected at step 2280 to the I/O pad. The lightly doped side is in direct contact with the well in which the MOS transistors are formed.

Figure 2:
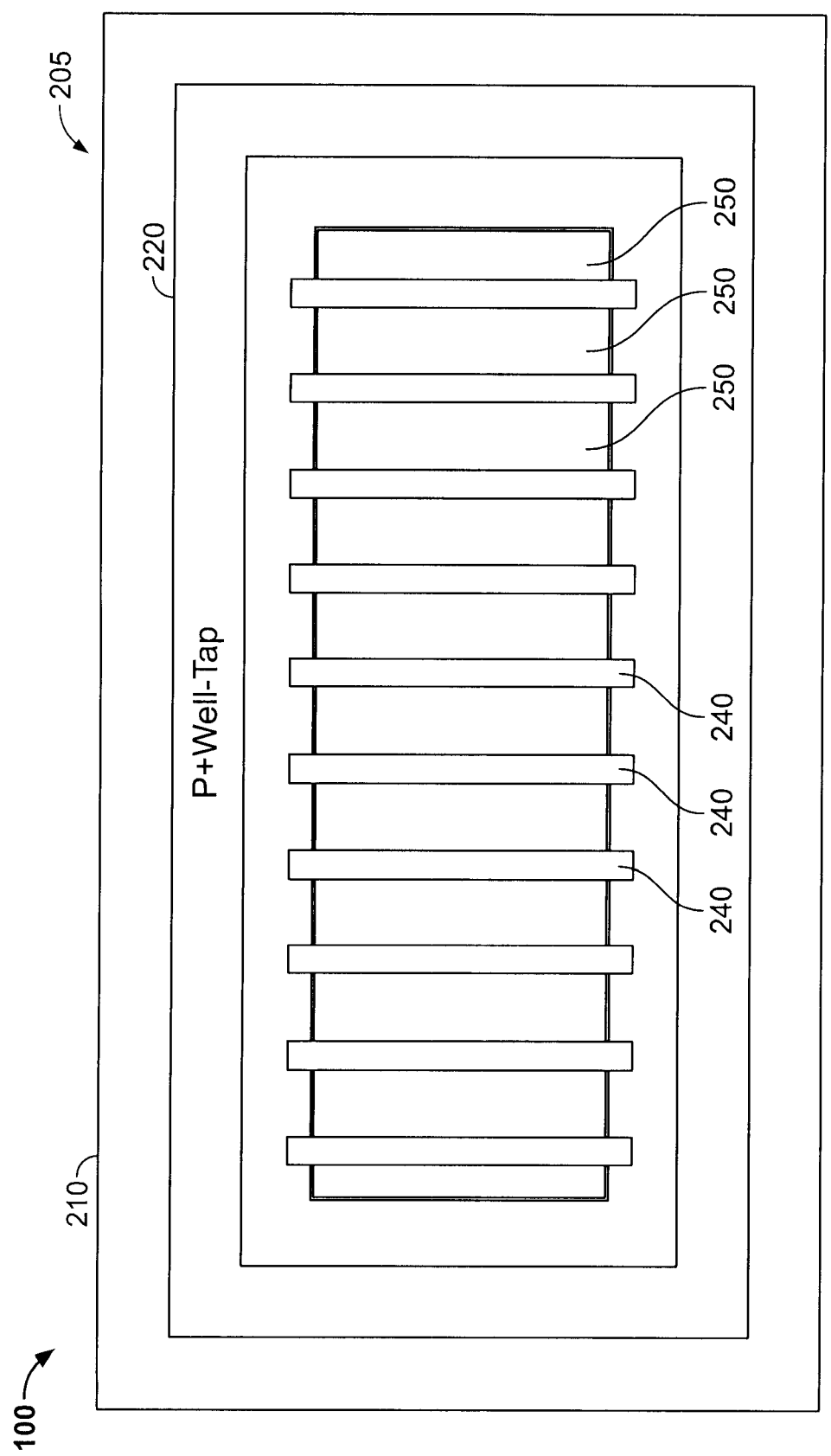
FIG. 2 is a top view of an implementation of the device of FIG. 1.
Figure 3:
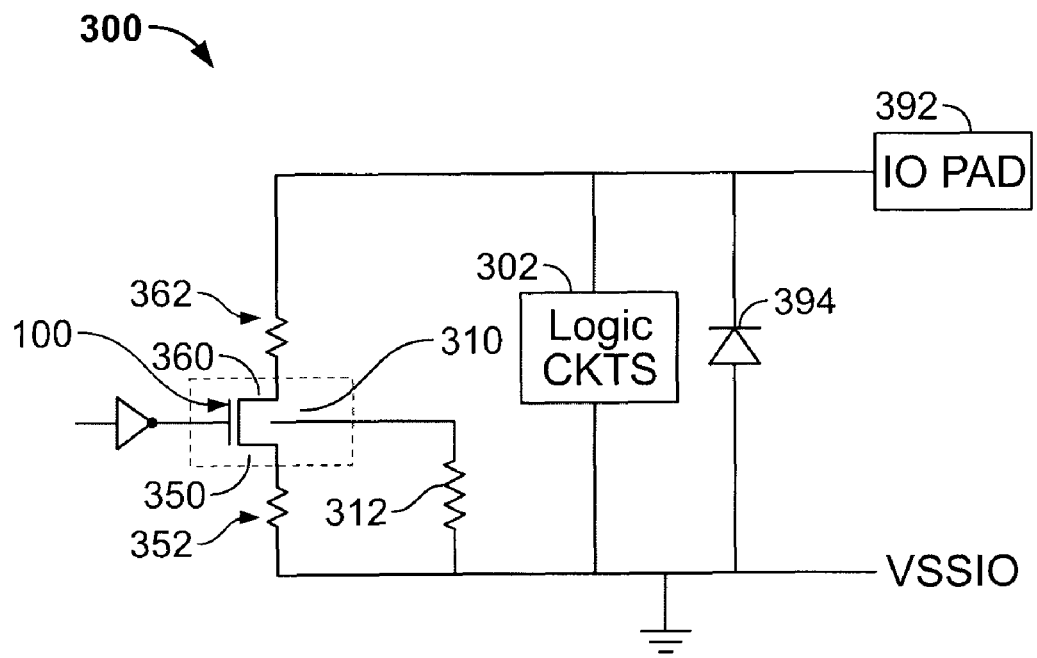
FIG. 3 is a circuit schematic for a conventional circuit that uses the device of FIG. 1.

As will be apparent to those skilled in the art, numerous variations may be made within the spirit and scope of the claims. For example, while the invention has been described in terms of NMOS transistors in P-wells with N+ source/drain regions, N+/PLDD diodes and P-type implants under the LDD regions, the invention may also be practiced in PMOS transistors in N-wells with P+ source/drain regions, P+/N LDD diodes and N-type implants under the LDD regions. In addition, while the pull-down device 400 has been depicted as formed of a plurality of transistors connected in parallel, it will be understood that it could also be implemented as a single transistor having multiple fingers as shown in the prior art device of FIG. 2 or in a combination of individual transistors connected in parallel and multi-fingered gate transistors.

What is claimed is:

1. An electrostatic discharge (ESD) protection circuit comprising:
   a body of first conductivity type;
   a first transistor having a source and drain of a second conductivity type formed in the body and a gate formed on the body, the source and drain being connected between ground and an input/output (I/O) pad; and
   a diode having a cathode and an anode of opposite conductivity types, the cathode being connected to the I/O pad and the anode to the body of the transistor.

2. The ESD circuit of claim 1 wherein the diode has a heavily doped cathode and a lightly doped anode.

3. The ESD circuit of claim 1 wherein the diode has a heavily doped cathode and an ion implanted anode.

4. The ESD circuit of claim 1 further comprising a second transistor having a source and drain of the second conductivity type formed in the same body as the first transistor, the source and drain being connected in parallel with the first transistor between ground and an I/O pad.

5. The ESD circuit of claim 4 wherein the diode is formed in a well separate from the body of the first and second transistors.

6. The ESD circuit of claim 5 wherein the anode of the diode is connected to a center tap in the body between the first and second transistors.

7. The ESD circuit of claim 4 wherein the diode is formed in the same body as the transistors.

8. The ESD circuit of claim 7 wherein the diode is formed between a source or drain region of second conductivity type and a light doped region of first conductivity type.

9. The ESD circuit of claim 7 wherein the diode is formed between a source or drain region of second conductivity type and an ion implanted region of first conductivity type.

10. The ESD circuit of claim 1 wherein the first conductivity type is P-type and the second conductivity type is N-type.

11. The ESD circuit of claim 1 wherein the first transistor has a plurality of gate fingers and source and drain regions on opposite sides of each gate finger.

12. An electrostatic discharge (ESD) protection circuit comprising:
    a body of first conductivity type;
    a plurality of transistors formed in the body, each transistor having a source and drain of a second conductivity type and a gate formed on the body, the source and drain of each transistor being connected in parallel between ground and an input/output (I/O) pad; and
    a diode having a cathode and an anode of the opposite conductivity types, the cathode being connected to the I/O pad and the anode to the body of the transistor.

13. The ESD circuit of claim 12 wherein the diode is formed in a well separate from the body of the first and second transistors.

14. The ESD circuit of claim 12 wherein the diode is formed in the same body as the transistors.

15. The ESD circuit of claim 12 wherein the first conductivity type is P-type and the second conductivity type is N-type.

* * * * *